(12) United States Patent
Lin et al.

(10) Patent No.: US 8,134,219 B2
(45) Date of Patent: Mar. 13, 2012

(54) SCHOTTKY DIODES

(75) Inventors: Xin Lin, Phoenix, AZ (US); Daniel J. Blomberg, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/150,831

(22) Filed: Jun. 1, 2011

(65) Prior Publication Data

US 2011/0227135 A1  Sep. 22, 2011

Related U.S. Application Data

(62) Division of application No. 12/474,038, filed on May 28, 2009, now Pat. No. 7,972,913.

(51) Int. Cl.
*H01L 27/095* (2006.01)
*H01L 29/47* (2006.01)
*H01L 29/812* (2006.01)
*H01L 31/07* (2012.01)
*H01L 31/108* (2006.01)

(52) U.S. Cl. .. 257/471; 257/472; 257/476; 257/E29.338

(58) Field of Classification Search .......... 257/471–476, 257/E29.338
See application file for complete search history.

(56) References Cited

U.S. PATENT DOCUMENTS

| 6,404,033 | B1 | 6/2002 | Chang et al. |
| 6,426,541 | B2 | 7/2002 | Chang et al. |
| 7,064,407 | B1 | 6/2006 | Mallikarjunaswamy |
| 7,282,386 | B2 | 10/2007 | Khemka et al. |
| 7,355,260 | B2 | 4/2008 | Khemka et al. |
| 2006/0151836 | A1 | 7/2006 | Salcedo et al. |
| 2007/0007545 | A1 | 1/2007 | Salcedo et al. |
| 2008/0012044 | A1 | 1/2008 | Salcedo et al. |
| 2009/0014791 | A1* | 1/2009 | Anderson et al. ............. 257/337 |
| 2010/0187577 | A1 | 7/2010 | Lin et al. |

* cited by examiner

*Primary Examiner* — Thien F Tran
(74) *Attorney, Agent, or Firm* — Ingrassia Fisher & Lorenz, PC

(57) ABSTRACT

Improved Schottky diodes with reduced leakage current and improved breakdown voltage are provided by building a JFET with its current path of a first conductivity type serially located between a first terminal comprising a Schottky contact and a second terminal. The current path lies (i) between multiple substantially parallel finger regions of a second, opposite, conductivity type substantially laterally outboard of the Schottky contact, and (ii) partly above a buried region of the second conductivity type that underlies a portion of the current path, which regions are electrically coupled to the first terminal and the Schottky contact and which portion is electrically coupled to the second terminal. When reverse bias is applied to the first terminal and Schottky contact, the current path is substantially pinched off in vertical or horizontal directions or both, thereby reducing the leakage current and improving the breakdown voltage of the device.

19 Claims, 8 Drawing Sheets

IMPLANT (A) FORM CENTRAL REGION 30 (N)

IMPLANT (B) FORM REGIONS 46 (N) AND 44 (P)

107

108

109

110

119

120

SCHOTTKY DIODES

RELATED APPLICATION

This application is a divisional of co-pending, U.S. patent application Ser. No. 12/474,038, filed on May 28, 2009.

FIELD OF THE INVENTION

The present invention generally relates to electronic devices and integrated circuits (ICs) and their methods of manufacture, and more particularly, structures and methods for forming Schottky diodes.

BACKGROUND

Schottky diodes are much used in modern electronic devices, especially integrated circuits (ICs). However, their performance and area efficiency are often less than ideal. Area efficiency refers to the chip area needed to obtain a Schottky diode of a given forward conduction capability, more precisely, the area efficiency is the ratio of the Schottky contact area to the total device area. For a given Schottky contact work function and Schottky contact area, the larger the overall device area for a given current handling capability, the lower the area efficiency. Lower than desired breakdown voltage and/or excess reverse bias leakage are also often troublesome performance limitations. Means and methods used in the prior art to limit the reverse bias leakage and improve breakdown voltage have typically caused a significant increase in the total area occupied by the Schottky device and therefore a further decrease in the area efficiency. It is well known that manufacturing cost of semiconductor devices and integrated circuits (ICs) is directly related to device and chip area. The larger the chip area needed to contain the required devices, the higher the manufacturing cost since the chips are generally batch fabricated in wafers of fixed diameter. A bigger chip means fewer chips per wafer and thus higher individual chip cost. Another consideration for Schottky diodes included in integrated circuits (ICs) is that they are desirably formed using the same technology and processing steps available for forming the IC in which they are included. This complicates the problem of manufacturing area efficient low leakage Schottky diodes since the available manufacturing process steps are constrained by the process needs of the remainder of the IC, which may be less than ideal for forming the Schottky diodes. Thus, a need continues to exist for improved Schottky diode structures and methods using processes that are compatible with available IC manufacturing technology, especially for Schottky diodes having low reverse leakage and good area efficiency.

BRIEF DESCRIPTION OF THE DRAWINGS

The present invention will hereinafter be described in conjunction with the following drawing figures, wherein like numerals denote like or analogous elements, and wherein.

DETAILED DESCRIPTION OF THE INVENTION

Figure 1:
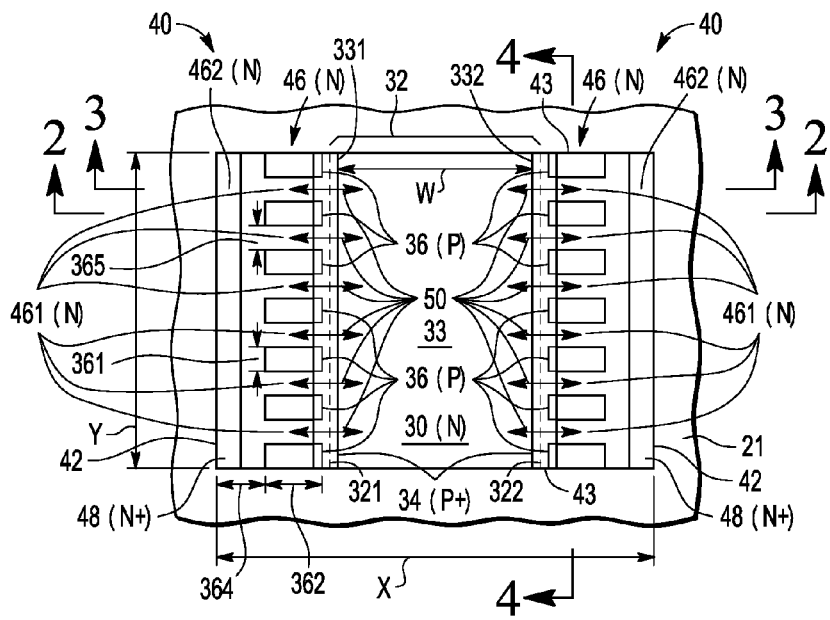
FIG. 1 is a simplified plan view of a Schottky diode, according to an embodiment of the present invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions or layers in the figures may be exaggerated relative to other elements or regions or layers to help improve understanding of embodiments of the invention.

The terms "first," "second," "third," "fourth" and the like in the description and the claims, if any, may be used for distinguishing among similar elements and not necessarily for describing a particular sequential or chronological order. It is to be understood that the terms so used are interchangeable under appropriate circumstances such that the embodiments of the invention described herein are, for example, capable of operation or fabrication in sequences other than those illustrated or otherwise described herein. Furthermore, the terms "comprise," "include," "have" and variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner.

As used herein, the term "semiconductor" is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline and amorphous structures, thin film structures, layered structures as for example and not intended to be limiting, semiconductor-on-insulator (SOI) structures, and combinations thereof. The term "semiconductor" is abbreviated as "SC." For convenience of explanation and not intended to be limiting, semiconductor devices and methods of fabrication may be described herein for silicon semiconductors but persons of skill in the art will understand that other semiconductor materials can also be used.

Further, as an aid to understanding the various embodiments, the convention is adopted of indicating an exemplary doping type for the different regions within the device by providing the illustrative doping type in parentheses following the relevant reference number. For example, when referring to "central region" 30, which in the illustrative embodiment may be N-type, this is referred to as central region 30(N). Other exemplary N and P regions are similarly identified. However, this is merely for convenience of explanation and not intended to be limiting and persons of skill in the art will understand that opposite conductivity types may also be used. More generally, the various doped regions may be referred to as of a "first" conductivity type that can be either N or P or of a "second, opposite" conductivity type that is then either P or N.

Figure 2:
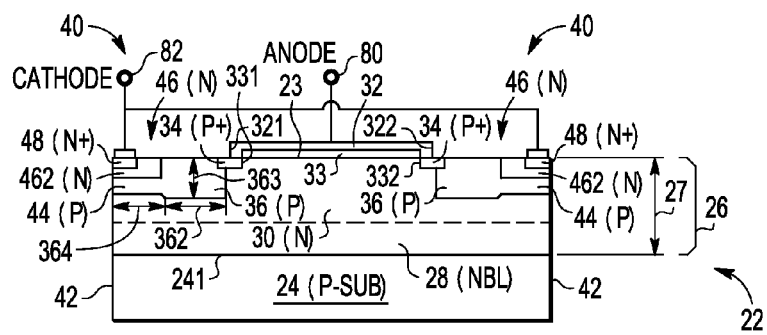
FIGS. 2-4 are simplified cross-sectional views through the device of FIG. 1 at different locations indicated in FIG. 1, illustrating the arrangement and relationship of various sub-surface regions.
Figure 3:
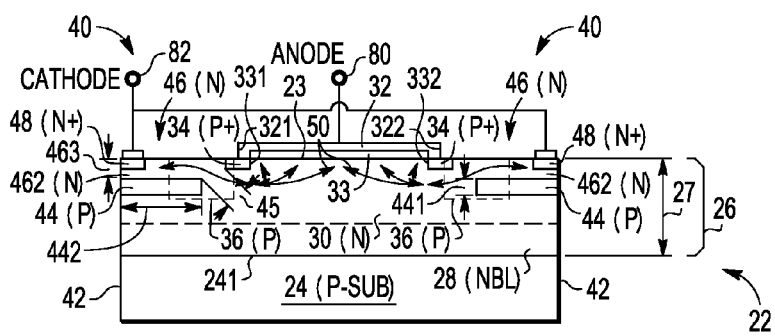
Figure 4:
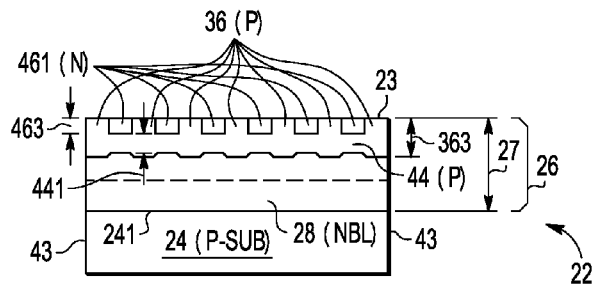

FIG. 1 is a simplified plan view of Schottky diode 20, according to an embodiment of the present invention and FIGS. 2-4 are simplified cross-sectional views through device 20 of FIG. 1 at different locations indicated in FIG. 1 illustrating the arrangement and relationship of various sub-surface regions. FIGS. 1-4 are discussed together. Device 20 comprises substrate 22 having upper surface 23. Substrate 22 may comprise any of the semiconductor materials and forms described above. For convenience of illustration, it is presumed hereafter to be a silicon substrate, but this is not intended to be limiting and any semiconductor (SC) material in any configuration (e.g., monolithic, layered, polycrystalline, etc., as noted above) may be used. Device 20 is further illustrated as comprising various N and P layers or regions (e.g., 30(N), 34(P+), 36(P), 44(P), 46(N), 48(N+), etc.), but this is merely for convenience of explanation of various exemplary embodiments and the parenthetic designations as (N) or (P) are merely by way of illustration and not intended to be limiting. Device 20 has lateral boundaries 42, 43 that are usually substantially laterally surrounded by dielectric isolation region 21, but this may be omitted in other embodiments. To avoid cluttering the drawings, dielectric isolation region 21 is omitted in the cross-sectional views of FIGS. 2-4. Various surface dielectric layers that are customarily provided for surface passivation, implant screening or interlayer insulation or isolation are omitted in FIGS. 1-20 to avoid cluttering the drawings and obscuring the invention.

Referring now to FIGS. 1-4, substrate 22 of device 20 is illustrated as comprising substrate region 24 (e.g., P-type, abbreviated as "P-SUB") and further doped region 26 above substrate region 24 extending to surface 23. N-type buried layer (BL) 28 identified as 28 (NBL) overlying substrate region 24 may be included in further doped region 26. Further region 26 has thickness 27 usefully in the range of about 0.5 to 4.0 micrometers, more conveniently about 1.0 to 3.0 micrometers, and preferably about 1.5 to 2.5 micrometers. Further doped region 26 (which may include layer 28 (NBL)) comprises various N and P doped regions, as explained below. N-type central portion 30 of further region 26 has thereon Schottky electrode contact 33 (abbreviated as SEC 33) extending between boundaries 331, 332. The choice of material for SEC 33 will depend upon the SC material used for surface 23 of further region 26 and central portion 30. Where surface 23 of region 26 and central portion 30 comprises silicon, then cobalt silicide, nickel silicide, tungsten silicide, titanium silicide, or nickel platinum silicide, and combinations thereof are suitable for forming SEC 33 but other conductors of suitable work function relative to the SC material of surface 23 in portion 30 may also be used. In a preferred embodiment, it is desirable to provide a metal, silicide or other conductor layer 32 overlying SEC 33 and extending onto portions of region 34(P+) between boundaries 321, 322 to facilitate ohmic contact to regions 34(P+) and external contact to SEC 33.

In FIG. 1, the letters X, Y, W are intended to indicate both directions and magnitudes. Conductor layer 32 overlying SEC 33 desirably extends across (vertical) width Y and laterally between boundaries 321, 322 of device 20 so as to make ohmic electrical contact to heavily doped SC contact regions 34(P+) as well as to underlying Schottky contact SEC 33 in central region 30(N). However, only the portion denoted by width W extending between inboard edges 331, 332 of contact regions 34(P+) form Schottky contact 33 to central region 30(N). In the embodiments illustrated in FIGS. 1-4, contact regions 34(P+) also extend substantially across width Y of device 20 but shorter or longer contact regions 34 may also be used. Doped finger regions 36(P) of the same conductivity type as contact regions 34(P+) are provided in the X (left-right) direction extending laterally outward from and making ohmic contact with contact regions 34(P+). Doped finger regions 36(P) have widths 361 and separation 365 in the Y direction, length 362 in the X direction, depth 363 substantially perpendicular to surface 23 (see FIGS. 1-2), and are spaced from regions 48(N+) adjacent ends 42 of device 20 by distances 364. Widths 361 are usefully in the range of about 0.2 to 1.5 micrometers, more conveniently about 0.3 to 1.2 micrometers, and preferably about 0.4 to 0.8 micrometers but larger or smaller values can also be used. Length 362 is usefully in the range of about 0.2 to 10.0 micrometers, more conveniently about 0.3 to 7.0 micrometers, and preferably about 0.4 to 5.0 micrometers but larger or smaller values can also be used. Depth 363 is usefully in the range of about 0.3 to 3.0 micrometers, more conveniently about 0.4 to 2.0 micrometers, and preferably about 0.5 to 1.5 micrometers but larger or smaller values can also be used. Distance 364 is usefully in the range of about 0.2 to 5.0 micrometers, more conveniently about 0.4 to 3.0 micrometers, and preferably about 0.5 to 1.5 micrometers but larger or smaller values can also be used. However, other orientations and/or dimensions may be used in other embodiments. Distances 365 separating finger regions 36(P) are usefully in the range of about 0.1 to 2.0 micrometers, more conveniently about 0.2 to 1.5 micrometers, and preferably about 0.25 to 1.0 micrometers but larger or smaller values can also be used in other embodiments.

Further doped regions 44(P) of thickness 441 and of the same conductivity type as finger regions 36(P) make ohmic electrical contact with finger regions 36(P) and extend distances 442 in the X directions from left and right ends 42 of device 20 so as to intersect finger regions 36(P). Further doped regions 44(P) desirably extend substantially across width Y of device 20, but shorter further doped regions 44(P) can also be used in other embodiments. Further doped regions 44(P) underlie surface 23 by distance 463, that is, they form (e.g., P type) buried layers underlying doped regions 461(N), 462(N) (collectively 46(N)) and desirably also underlying contacts 48(N+) in left and right end regions 40 of device 20. Thickness 441 of further doped regions 44(P) is usefully in the range of about 0.1 to 2.5 micrometers, more conveniently about 0.15 to 1.5 micrometers, and preferably about 0.2 to 0.8 micrometers but larger or smaller values can also be used. Length 442 of further doped regions 44(P) is usefully in the range of about 0.3 to 10.0 micrometers, more conveniently about 0.5 to 5.0 micrometers, and preferably about 1.0 to 3.0 micrometers, but larger or smaller values can also be used. Distances 463 separating regions 44(P) from surface 23 are usefully in the range of about 0.1 to 2.0 micrometers, more conveniently about 0.15 to 1.5 micrometers, and preferably about 0.2 to 1.0 micrometers, but larger or smaller values can also be used. Regions 46(N) of the same conductivity type as central portion 30(N) have portions 461(N) and portions 462 (N), collectively 46(N). Portions 461(N) extend in a vertical direction in FIG. 1 between doped finger regions 36(P) of width 365, and in a horizontal directions in FIG. 1 from contact regions 34(P+) toward left and right boundaries 42 of device 20 up to the leftward and rightward ends of finger regions 36(P) and also beneath contact regions 34(P+) so as to be in ohmic contact with central portion 30(N). Portions 462(N) extend from the leftward and rightward ends of finger regions 36(P) to at least contact regions 48(N+) and preferably to left and right boundaries 42 of device 20. Doped contact regions 48(N+) are provided in portions 462(N) of regions 46(N) at left and right boundaries 42 of device 20 so as to provide ohmic contact to regions 46(N). Contact regions 48(N+) desirably extend substantially across width Y of device 20, but shorter contact regions 48(N+) may also be used. While it is desirable to have contact regions 48(N+) located proximate left and right boundaries 42 of device 20, they may be located anywhere within regions 46(N) so long as regions 46(N) can be pinched off under reverse bias, as is discussed later. It is also desirable to provide a further (e.g., metallization) conductor (not shown) electrically coupling contact regions 48(N+) at left and right boundaries 42 of device 20.

For the doping types noted by way of example in FIGS. 1-4 and 5-10, region 32 with underlying SEC 33 forms the anode of device 20 and region 212 (see FIG. 10) with underlying contact regions 48(N+) form the cathode of device 20, but persons of skill in the art will understand that when, for example, N and P type regions are interchanged, that the designations of anode and cathode will also be interchanged. For the exemplary doping types shown in FIGS. 1-4, anode-cathode current 50 (see FIGS. 1 and 3), flows between region 32 (with SEC 33) and contacts 48(N+) via region 30(N), then left and right under contact regions 34(P+), then through portions 461(N) of regions 46(N) between finger regions 36(P), then on through portions 462(N) of regions 46(N) beyond finger regions 36(P) above buried region 44(P) to contacts 48(N+). Persons of skill in the art will understand that the double arrows on current lines 50 merely indicate that current flow is in one direction for forward conduction and in the opposite direction for reverse conduction.

The above-described arrangement provides for improved reverse breakdown characteristics (e.g., lower leakage current and higher breakdown voltage). In the following discussion (and elsewhere in this description), the P and N type doping illustrated in FIGS. 1-4 is assumed, but this is merely for convenience of explanation and persons of skill in the art will understand that the same action occurs even when the doping types are reversed. In the discussion of current flow and associated depletion under reverse bias, "horizontal" depletion refers to depletion in a direction parallel to surface 23 and "vertical" depletion refers to depletion in directions perpendicular to surface 23. Charged carriers flowing from region 32 (with SEC 33) into regions 30(N), 46(N) on the way to cathode contact 48(N+) must pass through portions 461(N) between finger regions 36(P). The combinations of finger regions 36(P) and interleaved portions 461(N) of width 365 of regions 46(N) lying between finger regions 36(P) form a parallel set of junction field effect transistors (JFETS). Since finger regions 36(P) are ohmically coupled to region 32 (e.g., the anode of device 20) via contacts 34(P+), finger regions 36(P) act as gates of the JFETS. When reverse bias is applied to region 32 and hence to fingers 36(P), conduction through portions 461(N) of regions 46(N) lying between fingers 36(P) is depleted horizontally. Vertical depletion can also occur (see FIG. 3) because charged carriers flowing from region 32 into regions 30(N), 46(N) on the way to cathode contact 48(N+) must pass through portions 461(N), 462(N) of regions 46(N) overlying buried layer region 44(P), wherein the parts of portions 461(N), 462(N) above region 44(P) can be depleted vertically under reverse bias since region 44(P) is also ohmically coupled to anode region 32 via regions 36(P) and 34(P+). Under a reverse bias, portions 461(N) of regions 46(N) surrounded by fingers 36(P) and regions 44(P) can also become depleted of carriers (i.e., pinched-off) in both horizontal and vertical directions. Thus, the arrangement illustrated in the embodiments of FIGS. 1-4 can achieve three-dimensional pinch-off, significantly reducing the reverse bias leakage current. After the conduction path is pinched off, the electric field across the Schottky contact will not increase with the reverse bias voltage and the electric field peaks at a location between regions 462(N) and 44(P), where the breakdown voltage is significantly higher than that at the Schottky contact itself. Thus, the arrangement illustrated in the embodiments of FIGS. 1-4 also significantly increases the reverse bias breakdown voltage. It will also be noted that further that in a preferred embodiment, doped regions 44(P) of length 442 in the X direction do not extend directly to contact regions 34(P+), but leave gap 45 therebetween. This is desirable so that forward conduction of device 20 is not significantly adversely impacted. Gap 45 is usefully in the range of about 0.2 to 10.0 micrometers, more conveniently about 0.25 to 5.0 micrometers, and preferably about 0.3 to 3.0 micrometers.

A further benefit of the embodiments illustrated in FIGS. 1-4 is that the area efficiency of device 20 is much improved compared to prior art devices. One of the reasons for this improvement is that none of the current path pinch-off regions underlie the SEC area, but are outboard thereof, and because most of semiconductor area can be used to form the Schottky contact. The area efficiency is defined as the percentage of SEC area divided by the total device area for a given forward current capability. In the device of FIG. 1, the SEC area is about Y*W and the total device area is about Y*X, so the area efficiency (AE) expressed as a percentage is about AE=100*(Y*W)/(Y*X). The area occupied by any surrounding dielectric isolation region 21 is neglected in comparing the present embodiments and the prior art. In typical prior art devices, area efficiencies AE~15% are common, whereas with the illustrated embodiments, area efficiencies AE~35% or higher are achievable for the same forward conduction capability. This is a significant advance in the art.

FIGS. 5-10 are plan views of the device of FIG. 1 during various stages of manufacture of the device of FIG. 1, according to still further embodiments of the invention. In FIGS. 5-10, the plan view outlines of the various device regions described in connection with FIGS. 1-4 are shown by light lines and the perimeter of the various mask openings used in FIGS. 5-9 to form these device regions are shown by heavy outlines and the open regions of the masks are hatched so as to be easily visible. It will be understood that the hatched regions in FIGS. 5-9 illustrate mask openings, and that the un-hatched regions represent the blocking portions of the various masks. Ion implantation is the preferred doping method but other doping methods well known in the art may also be used with appropriate changes in the choice of masking material. Photoresist is a suitable ion implantation masking material, but other hard and soft mask materials well known in the art may also be used. The various doping steps illustrated in FIGS. 5-9 may be performed in any order and the order in which they are described is merely for convenience of explanation and not intended to be limiting or imply that such order is required. The implant dopants, densities and dopant concentrations given below are for the case where substrate 22 is of silicon, but this is merely for convenience in describing preferred embodiments and not intended to be limiting. Persons of skill in the art will understand that other dopants, doping densities, energies and dopant concentrations are appropriately used with other materials, substrate structures and choices of anode-cathode polarity.

Figure 5:
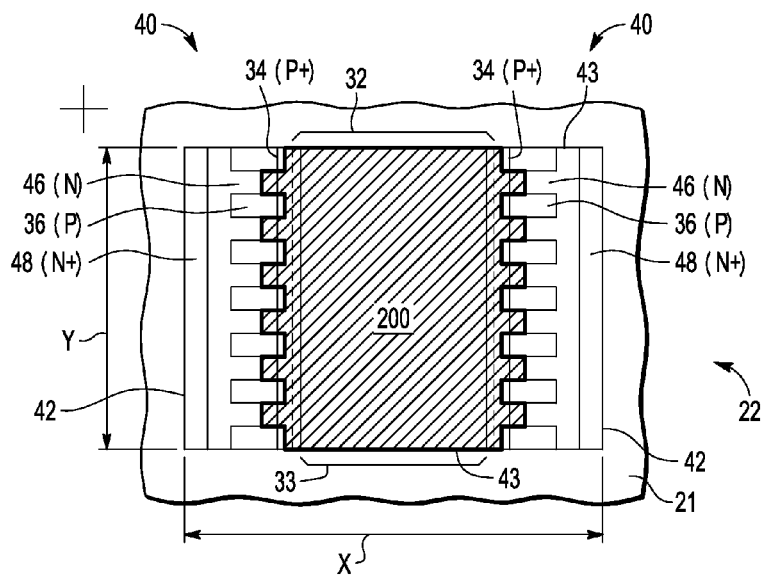
FIGS. 5-10 are plan views of the device of FIG. 1 during various stages of manufacture of the device of FIG. 1, according to further embodiments of the invention.

Referring now to manufacturing stage 105 of FIG. 5, mask opening 200 is provided through which doped central region 30 of substrate 22 is formed, for example, by implanting impurities whose conductivity type depends upon the desired resulting conductivity type for the Schottky electrode contact (SEC) region. In the examples given in connection with FIGS. 1-4, net N type doping is used. Implant (A) provides doped central region 30(N) with a surface dopant concentration in the vicinity of about 0.8-2E17 $cm^{-3}$ and a peak concentration of about 0.6-1E18 $cm^{-3}$ about 0.5 microns below surface 23, thereafter tailing off to interface 241 with P-type substrate region 24(P-SUB) at about 1.5-2.0 micrometers below surface 23. Region 24(P-SUB) conveniently has a doping level of about 1-2E15 $cm^{-3}$, but higher or lower doping levels can also be used. Where substrate region 24 is P-type, it is desirable to provide region or layer 28(NBL) via a conventional N-type buried layer implant. Where starting substrate 22 is lightly doped (e.g., about 1-2E15 $cm^{-3}$) N-type, a P-type buried layer implant is desirably included. Either arrangement is useful.

Figure 6:
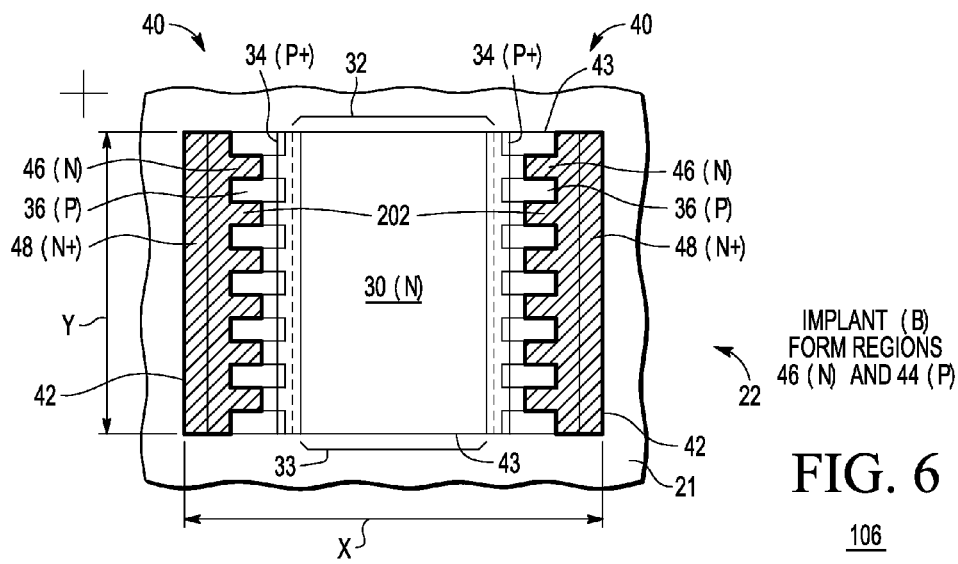

Referring now to manufacturing stage 106 of FIG. 6, mask openings 202 are provided through which doped regions 46(N) and 44(P) of substrate 22 are formed, for example, by implanting impurities of the same type as in central region 30(N) for regions 46(N) and of opposite conductivity type for regions 44(P). In the examples given in connection with FIGS. 1-4, net N type doping is used for region 46(N) and net P-type doping is used for region 44(P). Regions 44(P) and 46(N) may be formed using separate masking steps or, as shown here, by using common mask opening 202 to form both regions 44(P) and 46(N) with different dopants and different energies to achieve different depths of penetration and net doping as previously explained. These are collectively referred to as Implant (B). As noted above, this may be augmented in some embodiments by the same NBL described in connection with FIG. 5. Implant (B) provides doped region 46(N) with a dopant concentration of about 1-2E17 $cm^{-3}$ to depth 463 (see FIG. 3) of about 0.3 micrometers and provides doped region 44(P) with a peak concentration of about 4E17 $cm^{-3}$ and thickness 441 (see FIG. 3) of about 0.3 micrometers, followed by an N doped region 28(NBL) extending from about 0.6 micrometers to interface 241 (see FIGS. 2-4) with region 24(P-SUB) at a depth of about 1.5-2.0 micrometers beneath surface 23. Thus, mask opening 202 can be used to provide both regions 46(N) and regions 44(P) by appropriate choice of dopants and implant energies. While the above described implants using both N and P type dopants to form regions 46(N) and 44(P) using common mask 202 is referred to as Implant (B), persons of skill in the art will understand that Implant (B) may be subdivided into separate Implant (B1) for forming regions 46(N) and Implant (B2) for forming regions 44(P). Either arrangement is useful.

Figure 7:
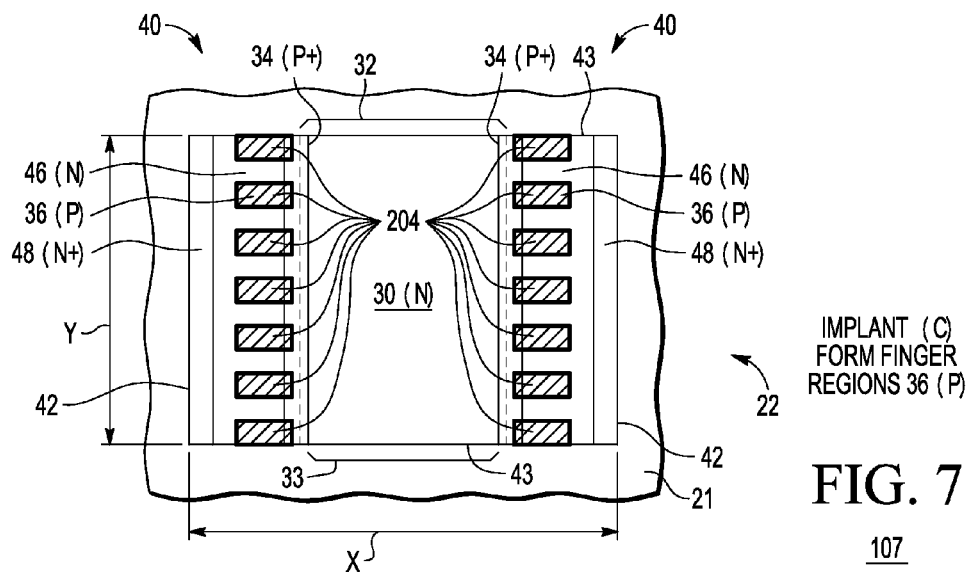

Referring now to manufacturing stage 107 of FIG. 7, mask openings 204 are provided through which doped finger regions 36(P) of substrate 22 are formed, for example, by implanting appropriate impurities, such as P-type where regions (e.g., 36(P)) are desired, and N-type if regions (e.g., 36(N)) are desired with corresponding changes in the doping of the other regions within device 20. In the examples given in connection with FIGS. 1-4, net P type doping is used to provide regions 36(P), referred to collectively as Implant (C). This provides finger regions 36(P) with a dopant concentration in the range of about 0.1-5E18 $cm^{-3}$, more preferably about 0.3-3E18 $cm^{-3}$, extending to depth 363 (see FIG. 2) about 0.6-0.7 microns below surface 23, where an N-doped region (e.g., region 28(NBL) extending beneath finger regions 36(P) is encountered, which trails off to interface 241 with region 24(P-SUB) at about 1.5-2.0 micrometers below surface 23.

Figure 8:
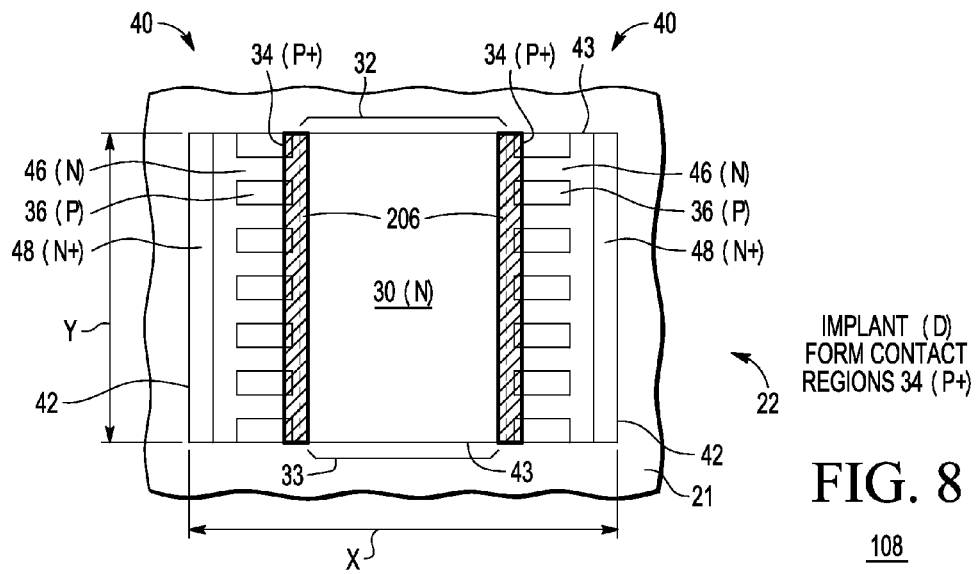

Referring now to manufacturing stage 108 of FIG. 8, mask openings 206 are provided through which contact regions 34 of substrate 22 are formed, by implanting appropriate impurities whose conductivity type depends upon the desired resulting conductivity type for regions 34, for example, such as regions 34(P+). In the examples given in connection with FIGS. 1-4, P+ doping is used, referred to as Implant (D). This provides contact regions 34(P+) of depth about 0.15 micrometers and doping density of about 1E20 $cm^{-3}$ in ohmic contact with finger regions 36(P).

Figure 9:
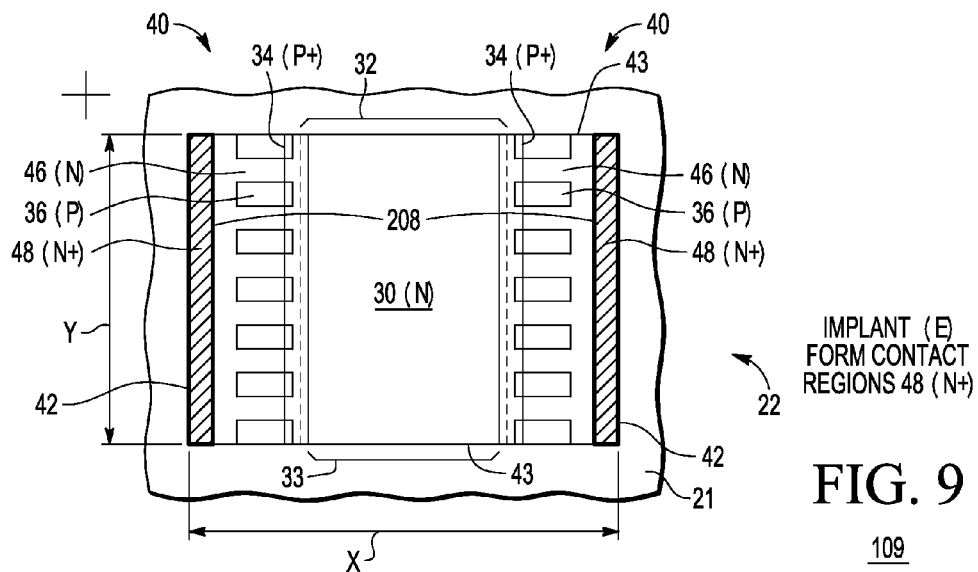

Referring now to manufacturing stage 109 of FIG. 9, mask openings 208 are provided through which contact regions 48 of substrate 22 are formed, for example, by implanting impurities whose conductivity type depends upon the desired resulting conductivity type for regions 48. In the examples given in connection with FIGS. 1-4, N+ doping is used to provide contact regions 48(N+), referred to as Implant (E). This provides doped contact regions 48(N+) of depth about 0.15 micrometers and doping density of about 1E20 $cm^{-3}$ in ohmic contact with regions 462(N).

Figure 10:
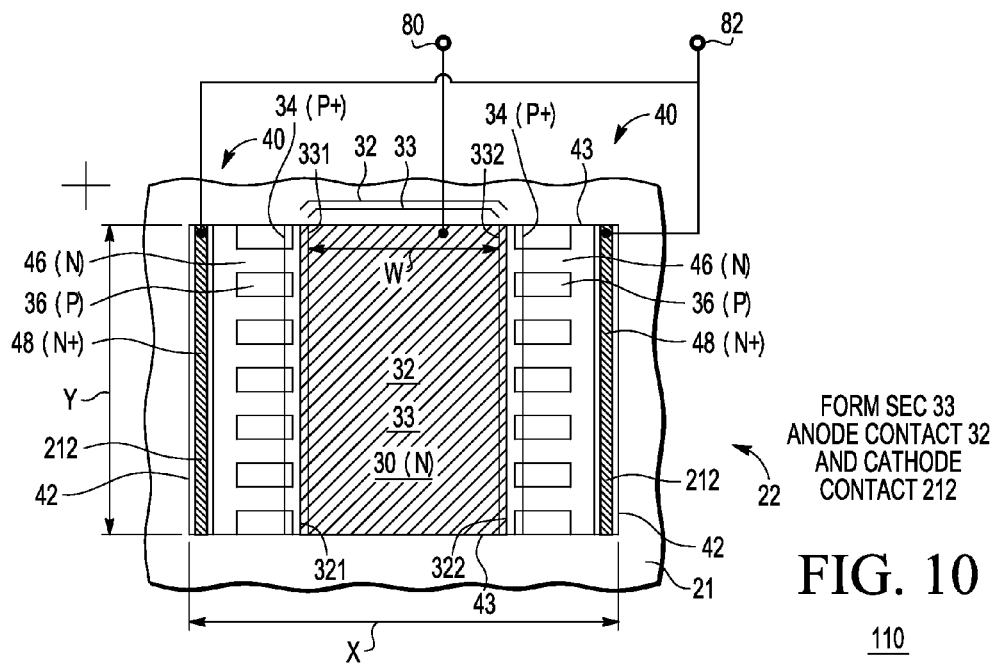

Referring now to manufacturing stage 110 of FIG. 10, Schottky electrode contact (SEC) 33 is provided over central region 30(N), e.g., between boundaries 331, 332, typically by evaporation or sputtering of an appropriate metal (e.g., Co, Ni, W, Ti, NiPt or combinations thereof) on semiconductor surface 23 in central region 30(N). Overlying conductor region 32 (e.g., of a metal, silicide or combination thereof) is desirably provided extending between boundaries 321, 322, overlying SEC 33 and portions of contact region 34(P+) and in Ohmic contact with both. At the same time or during subsequent manufacturing steps (not illustrated), it is convenient to provide conductive cathode contact 212 (e.g., of a metal, silicide or combination thereof) to semiconductor region 48(N+). As shown schematically by connections 80, 82, conductive contacts are also desirably provided to whatever associated circuitry that device 20 may form a part. Persons of skill in the art will understand how to perform such metallization and associated masking steps depending on the particular semiconductor and the number of interconnect levels and interconnections that may be used in their particular application.

Figure 11:
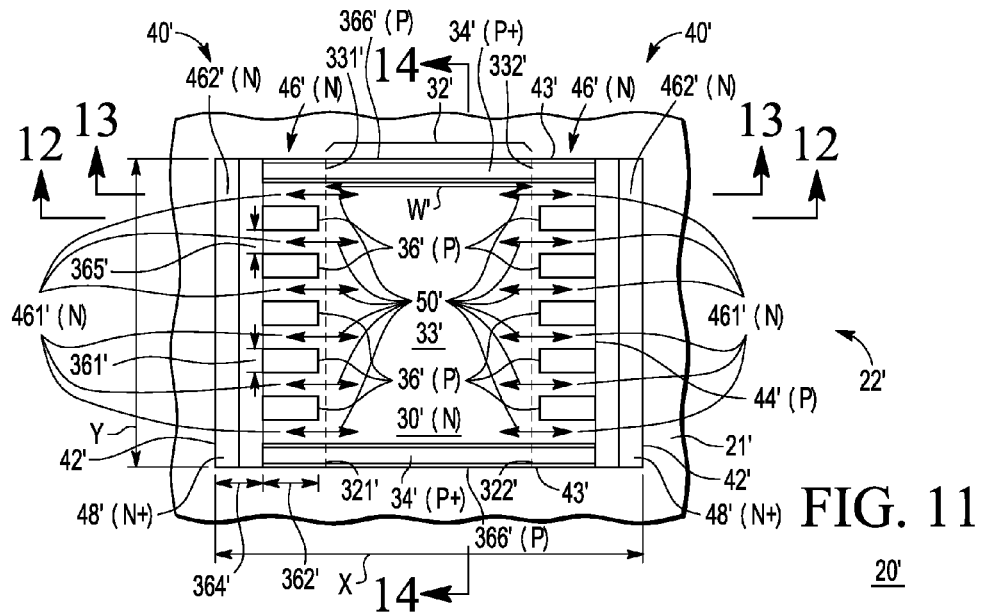
FIG. 11 is a plan view similar to FIG. 1, but according to a still further embodiment of the invention.
Figure 12:
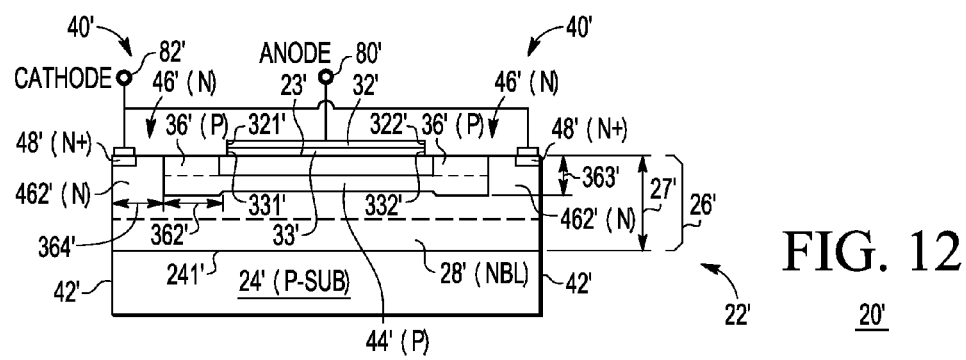
FIGS. 12-14 are simplified cross-sectional views through the device of FIG. 11 at different locations indicated in FIG. 11, illustrating the arrangement and relationship of various sub-surface regions.
Figure 13:
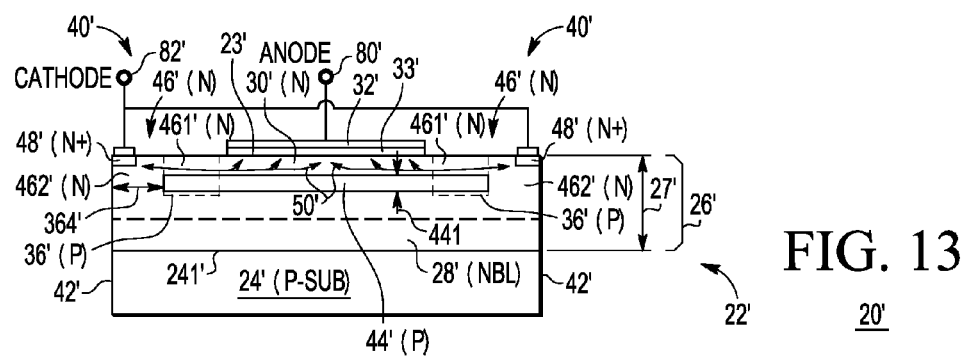
Figure 14:
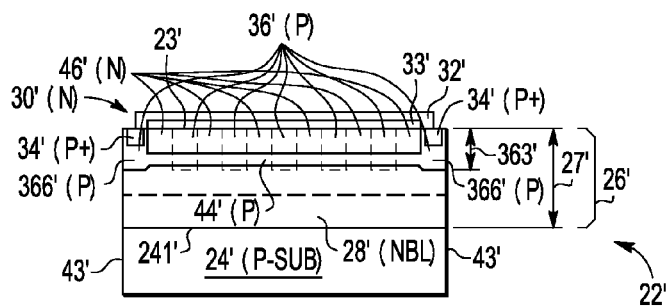

FIG. 11 is a plan view similar to FIG. 1, but of Schottky device 20' according to still further embodiments of the invention and FIGS. 12-14 are simplified cross-sectional views through the device of FIG. 11 at different locations indicated in FIG. 11, illustrating the arrangement and relationship of various sub-surface regions. As will be subsequently explained in connection with FIGS. 15-20, device 20' can be formed using the same implants as device 20 but with different mask arrangements so that the various doped regions have different lateral layouts but substantially the same depths, thicknesses and doping concentrations as previously described. The convention is followed in FIGS. 11-20 of identifying regions therein analogous to similar regions or dimensions in FIGS. 1-10 by the same reference numbers with a prime (') added. Accordingly, the discussion of FIGS. 1-10 should also be referred to for appropriate details. FIGS. 11-14 are considered together. Finger regions 36'(P) are formed in substantially the same manner (e.g., using Implant (C)) as described for finger regions 36(P) and in substantially the same locations. However, central region 30'(N) is formed using Implant (B) rather than Implant (A), so that buried layer region 44'(P) is formed underlying central region 30'(N). Buried layer 28'(NBL) may be included where starting substrate 22' is P-type having region 24'(P-SUB) or buried layer 28'(PBL) may be included where starting substrate 22' is N-type, as has been previously explained. Buried layer region 44'(P) extends to the outboard (left-right) ends of finger regions 36'(P) and is in ohmic contact therewith, thus coupling the several finger regions 36'(P) together. This arrangement is most clearly seen in FIGS. 11 and 13. Regions 461'(N) and 462'(N) are formed using Implants B and A, respectively, thereby providing regions 462'(N) in ohmic contact with (and desirably also under) cathode contacts 48'(N+) provided by Implant (E). In the arrangement illustrated in FIGS. 11-14, contact 34'(P+) is formed along or proximate upper and lower boundaries 43' of device 20', so as to be in ohmic contact with fingers 366'(P) extending along or proximate upper and lower boundaries 43' of device 20'. This is most clearly seen in FIGS. 11 and 14.

Figure 20:
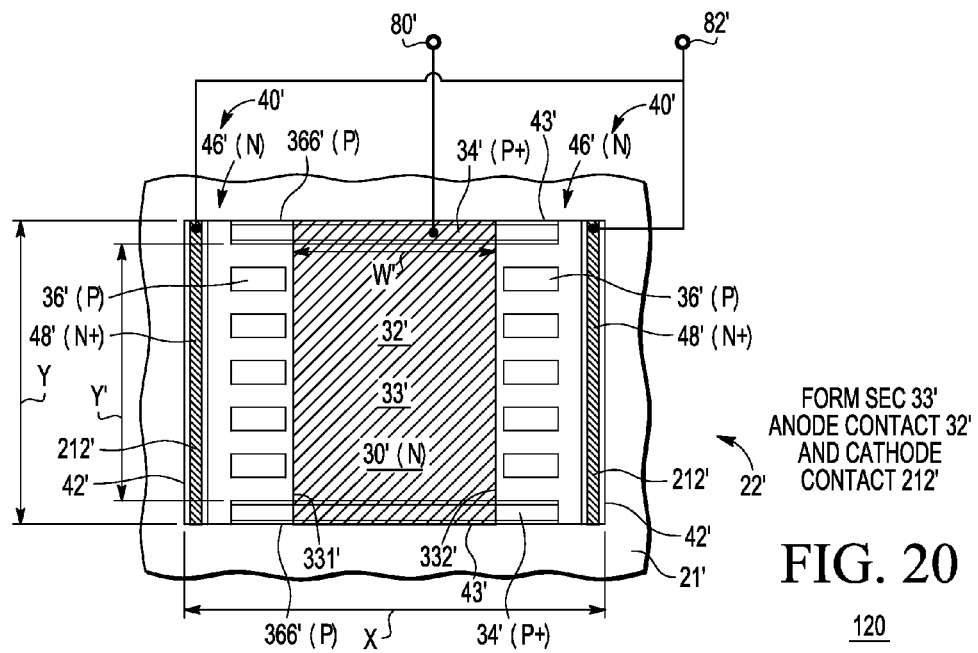

As illustrated in FIGS. 11 and 13, anode-cathode current 50' flows to/from region 32' to cathode contact 48'(N+) through regions 461'(N) between buried layer 44'(P) and surface 23' and at the same time through regions 461'(N) between finger regions 36'(P). When reverse bias is applied to anode contact region 32' (with Sec 33') with respect to cathode contact region 212' (with 48'(N+)) (see. FIG. 20), then buried layer 44'(P) and finger regions 36'(P) act as gates of the inherent JFET, thereby depleting carriers in the current path in both the horizontal direction (parallel to surface 23') and vertical direction (parallel to the plane of FIGS. 12-14). Thus, the 3-D reverse current limiting action described in connection with FIGS. 1-4 is also provided by the embodiments illustrated in connection with FIGS. 11-14, and both leakage current and breakdown voltage improved for the same reasons. The area efficiency of the arrangement of FIGS. 11-14 is also better than the prior art for the same reasons discussed in connection with FIGS. 1-4, that is, the depletable regions (which correspond to regions 461'(N)) can lie laterally outside of SEC 33' and take up comparatively little space on device 20'. Accordingly, area efficiencies comparable to that described in connection with FIGS. 1-4 are also achieved with the arrangement of FIGS. 11-14. In the embodiments of FIGS. 11-14, lateral (X-direction) boundaries 321, 322 of overlying conductor 32' and lateral boundaries 331, 332 of SEC 33' (see FIGS. 11-12) are substantially coincident, but may be different in other embodiment.

FIGS. 15-20 are plan views of the device of FIG. 11 during various stages of manufacture of the device of FIG. 11, according to yet further embodiments of the invention. In FIGS. 15-20, the plan outlines of the various device regions described in connection with FIGS. 11-14 are shown by light lines and the perimeter of the various mask openings used in FIGS. 15-19 to form these device regions are shown by heavy outlines. The open regions of the masks are hatched so as to be easily visible. It will be understood that the hatched regions in FIGS. 15-19 illustrate mask openings, and that the un-hatched regions represent the blocking portions of the various masks. Ion implantation is the preferred doping method but other doping methods well known in the art may also be used with appropriate changes in the choice of masking material. Photoresist is a suitable ion implantation masking material, but other hard and soft mask materials well known in the art may also be used. The various doping steps illustrated in FIGS. 15-19 may be performed in any order and the order in which they are described is merely for convenience of explanation and not intended to be limiting or imply that such order is required. The implant dopants and doping concentrations given are for the case where substrate 22' is of silicon, but this is merely for convenience in describing preferred embodiments and not intended to be limiting. Persons of skill in the art will understand that other dopants and doping concentrations are appropriately used with other materials, substrate structures and choices of anode-cathode polarity. The implants referred to as Implants (A), (B), (C), (D) and (E) in connection with FIGS. 15-20 are the same as those already described in connection with FIGS. 5-10 and the description thereof and the resulting doping concentrations, depths, etc., also apply in connection with FIGS. 15-20.

Figure 15:
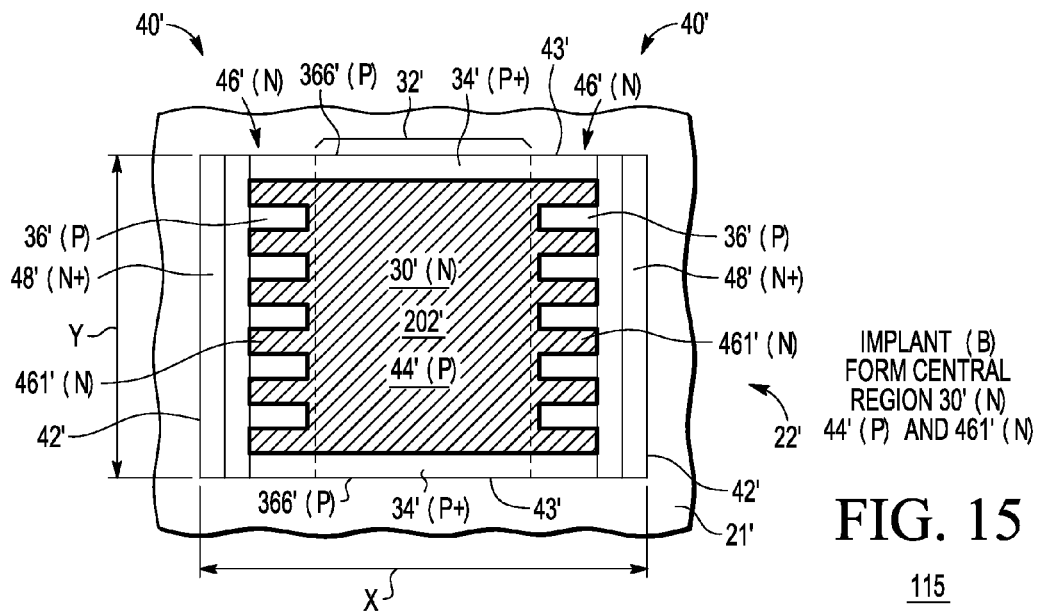
FIGS. 15-20 are plan views of the device of FIG. 11 during various stages of manufacture of the device of FIG. 11, according to yet further embodiments of the invention.

Referring now to manufacturing stage 115 of FIG. 15, mask opening 202' is provided and used in connection with Implant (B) to provide doped central region 30'(N) and region 461'(N) of substrate 22' with underlying buried layer region 44'(P), as illustrated in FIGS. 11-14. As explained in connection with FIG. 6 where Implant (B) is described, the combination of doping concentrations and depths can be used to form N type regions (e.g., region 30'(N) and region 461'(N)) and the P doped regions (e.g., region 44'(P)) using single mask opening 202', either in a combined Implant (B) or in two Implants (B1) and (B2) as previously described. Either arrangement is useful. In will be recalled that Implant (A) was used with mask 200 to form central region 30(N) in FIG. 5, while in FIG. 15, Implant (B) is used with mask 202' to form central region 30'(N), region 461'(N) and underlying region 44'(P). In the device of FIGS. 11-14, principal current flow 50' (see FIGS. 11 and 13) occurs in region 30'(N) and region 461'(N). Underlying buried region 44'(P) is in Ohmic contact with regions 36'(P) that have been or will subsequently be provided.

Figure 16:
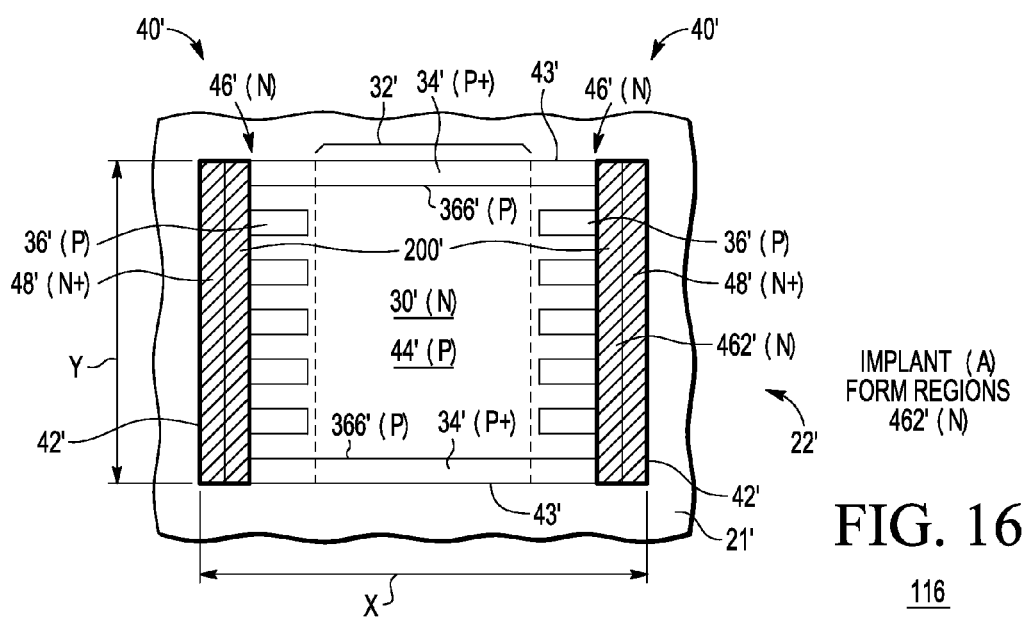

Referring now to manufacturing stage 116 of FIG. 16, mask opening 200' is used in connection with Implant (A) to provide regions 462'(N) extending substantially from the location of regions 36'(P) to lateral (left-right) boundaries 42' of device 20'. Referring back to FIGS. 11-14, it will be appreciated that portion 461'(N) of region 46'(N) lying between finger regions 36'(P) and portions 462'(N) of region 46'(N) lying between finger regions 36'(P) and boundaries 42' of device 20' are formed by Implant (B) and Implant (A), respectively. Portions 462'(N) of region 46'(N) also desirably extend underneath contact region 48'(N+) but this may be omitted in other embodiments.

Figure 17:
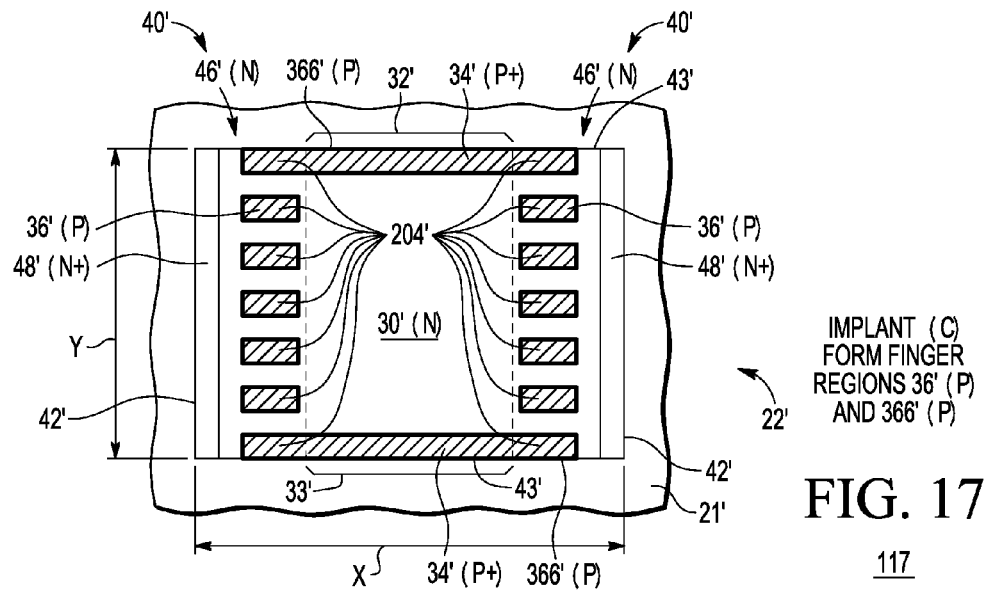
Figure 18:
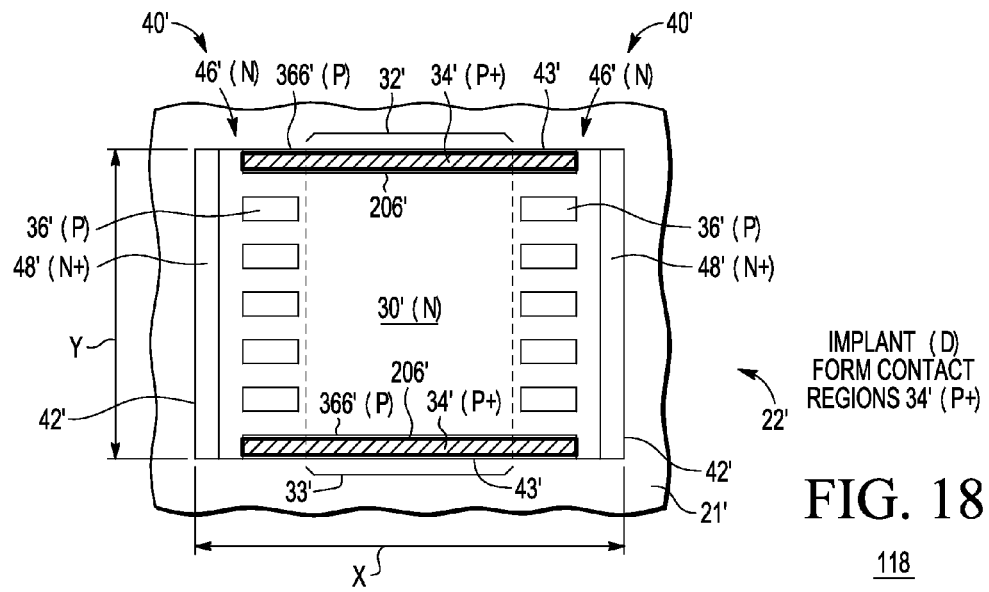
Figure 19:
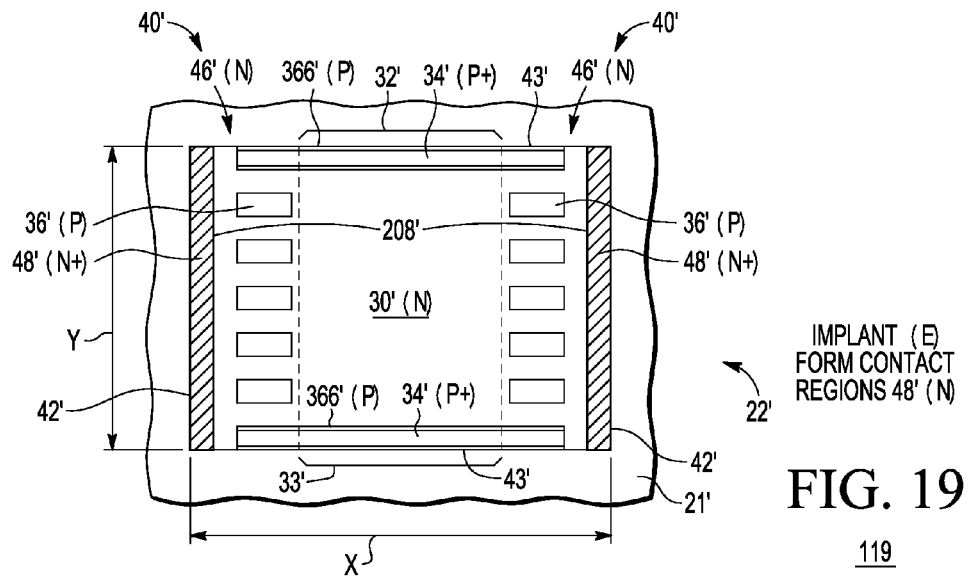

Referring now to manufacturing stage 117 of FIG. 17, mask 204' is used in connection with Implant (C) to provide finger regions 36'(P), in much the same manner as described in connection with FIG. 7. However, in manufacturing stage 117 of FIG. 17, extended fingers 366'(P) are desirably provided along or proximate boundaries 43' of device 20', having substantially the same doping and depth as the remainder of fingers 36'(P). The result may also be seen in FIGS. 11 and 14. Referring now to manufacturing stage 118 of FIG. 18, mask 206' is used in connection with Implant (D) to form contact regions 34'(P+) to extended fingers 366'(P) along or proximate boundaries 43' of device 20'. The result is also visible in FIG. 14. In manufacturing stage 119 of FIG. 19, mask 208' is used with Implant (E) to provide contact region 48'(N+) in substantially the same manner as already described in connection with FIG. 9. This result may also be seen in FIGS. 11-13.

Referring now to manufacturing stage 120 of FIG. 20, Schottky electrode contact (SEC) 33' is provided over central region 30'(N), typically by evaporation or sputtering of an appropriate metal such as has been previously described in connection FIG. 10. Width W' of SEC 33' is similar to width W illustrated in FIG. 10, extending between boundaries 331', 332'. Further conductor 32' analogous to conductor 32 of FIGS. 1-4 is desirably provided over SEC 33' extending laterally in the X direction between boundaries 321', 322' that are in this embodiment substantially coincident with boundaries 331', 332' of SEC 33'. In the Y direction SEC 33' preferably extends between regions 34'(P+). This distance is denoted as Y'. In the Y direction conductor 32' overlies SEC 33' and extends onto regions 34'(P+). Conductor 32' makes Ohmic contact to both SEC 33' and contact region 34'(P+) of region 366'(P). At the same time or during subsequent manufacturing steps (not illustrated), it is convenient to provide conductive cathode contact 212' (e.g., of a metal, silicide or combination thereof) to semiconductor region 48'(N+). As shown schematically by connections 80', 82', conductive contacts are also desirably provided to whatever associated circuitry of which device 20' may form a part. Persons of skill in the art will understand how to perform such metallization and associated masking steps depending on the particular semiconductor and the number of interconnect levels and interconnections that may be used in their particular application.

The above-described arrangement for device 20' provides for improved reverse breakdown characteristics (e.g., lower leakage current and higher breakdown voltage) for substantially the same reasons as have already been explained in connection with device 20. The anode-cathode current flow path is automatically depleted in both horizontal and vertical directions under reverse bias so that leakage current is reduced and breakdown voltage is increased over what would be obtained from a plain Schottky diode. For device 20' of FIGS. 11-20, the area efficiency is given by the ratio of the SEC area of about Y'*W' (see FIG. 20) divided by the total device area of about Y*X, so the area efficiency (AE') of device 20' expressed as a percentage is about AE'=100* (Y'*W')/(Y*X). The areas efficiency of device 20' is also high, for the same reasons explained in connection with device 20.

According to a first embodiment, there is provided a Schottky diode (20, 20') having first (80, 80', 32, 32') and second (82, 82', 212, 212') terminals, comprising, a semiconductor (SC) substrate (22, 22') having a first region (30, 30') of a first conductivity type and first doping concentration proximate a first surface (23, 23') of the substrate (22, 22'), a Schottky electrode contact (33, 33') on the first surface (23, 23') of the first region (30, 30') forming a Schottky junction therebetween, wherein the Schottky electrode contact (33, 33') is ohmically coupled to the first terminal (80, 80' 32, 32'), a second region (46, 46') of the first conductivity type and second doping, contacting the first region (30, 30'), laterally separated from the Schottky electrode contact (33, 33') and ohmically coupled to the second terminal (82, 82', 212, 212'), multiple finger regions (36, 36') of a second, opposite, conductivity type and third doping ohmically coupled to the first terminal (80, 80', 32, 32') and extending from the first region (30, 30') into the second (46, 46') region, wherein first portions (461, 461') of the second region (46, 46') lies between the multiple finger regions (36, 36'), a further region (44, 44') of the second conductivity type and fourth doping, located in the second region (46, 46') spaced apart from the first surface by the first portions (461, 461') of the second region (46, 46') and ohmically coupled to the first terminal (80, 80', 32, 32'), wherein the further region (44, 44'), the multiple finger regions (36, 36') and the second region (46, 46') form a junction field effect transistor (JFET), with the further region (44, 44') and the multiple substantially parallel finger regions (36, 36') adapted to act as gates of the JFET and the second region (46, 46') adapted to contain a channel of the JFET. According to a further embodiment, the multiple finger regions (36, 36') are substantially parallel. According to a still further embodiment, the multiple finger regions (36, 36') are divided substantially into two groups, a first group of multiple substantially parallel finger regions (36, 36') extending away from the Schottky electrode contact (33, 33') in a first direction and a second group of multiple substantially parallel finger regions (36, 36') extending away from the Schottky electrode contact (33, 33') in a second direction. According to a yet further embodiment, the first and second directions are substantially anti-parallel. According to a still yet further embodiment, the multiple finger regions (36, 36') are more heavily doped than portions (461, 461') of the second region (46, 46') lying between the multiple finger regions (36, 36'). According to a yet still further embodiment, the multiple finger regions (36, 36') are comparably or more heavily doped than the first region (30, 30'). According to another embodiment, first region (30, 30') is comparably or more heavily doped than the first portions (461, 461') of the second region (46, 46'). According to a still another embodiment, the further region (44, 44') underlies at least part of the first portion (461, 461') of the second region (46, 46'). According to a yet another embodiment, the further region (44, 44') also underlies at least part of the second portion (462, 462') of the second region (46, 46') or the first region (30, 30'). According to a still yet another embodiment, when the diode (20, 20') is reverse biased, the channel of the JFET is substantially depleted of free carriers for voltages above a predetermined magnitude.

According to a second embodiment, there is provided a Schottky device (20, 20'), comprising, first (80, 80', 32, 32') and second (82, 82', 212, 212') terminals, wherein the first terminal (80, 80', 32, 32') comprises a Schottky contact (33, 33'), a JFET within the Schottky device (20, 20') having a current path (50, 50') of a first conductivity type serially coupled between the first terminal (80, 80', 32, 32') and the second (82, 82', 212, 212') terminal, multiple finger regions (36, 36') laterally outboard of the Schottky contact (33, 33') and of a second, opposite, conductivity type and substantially enclosing a portion of the current path (50, 50') between the first terminal (80, 80', 32, 32') and the second terminal (82, 82', 212, 212'), and a buried region (44, 44') of the second conductivity type at least partly underlying the current path (50, 50') and ohmically coupled to the multiple finger regions (36, 36'), and wherein the multiple finger regions (36, 36') and the buried region (44, 44') are electrically coupled to the first terminal (80, 80',32, 32') and adapted to at least partially pinch off the current path (50, 50') in response to a reverse bias applied between the first terminal (80, 80', 32, 32') and the second terminal (82, 82', 212, 212'). According to a further embodiment, the buried region (44, 44') intersects a portion of the multiple finger regions (36, 36'). According to a still further embodiment, the multiple finger regions (36, 36') are substantially parallel or anti-parallel. According to a yet further embodiment, about half of the multiple finger regions (36, 36') are located on a first side of the Schottky contact (33, 33') and about half are located on a second side of the Schottky contact. According to a still yet further embodiment, the current path (50, 50') is N type. According to a yet still further embodiment, the multiple finger regions (36, 36') are more heavily doped than at least part of the current path (50, 50').

According to a third embodiment, there is provided a method for forming a Schottky diode (20, 20'), comprising, providing a semiconductor containing substrate (22, 22') having an upper surface (23, 23'), doping an upper portion (46, 46') of the substrate (22, 22') to have a first conductivity type extending substantially to the upper surface (23, 23'), providing multiple spaced-apart finger regions (36, 36') of a second, opposite, conductivity type, wherein first parts (461, 461') of the upper portion (46, 46') of the substrate (22, 22') lie between some of the spaced-apart finger regions (36, 36'), forming a buried further region (44, 44') of the second, opposite, conductivity type underlying at least part of the first parts (461, 461') of the upper portion (46, 46'). forming a Schottky contact (33, 33') on a part of the upper surface (23, 23') lying for the most part laterally beyond the spaced-apart finger regions (36, 36'), and coupling the spaced-apart finger regions (36, 36') and the further buried region (44, 44') to the Schottky contact (33, 33') and to a first terminal (80, 80', 32, 32') of the device (20, 20'), and coupling a second part (462, 462') of the upper portion (46, 46') to a second terminal (82, 82', 212, 212') of the device (20, 20'). According to a further embodiment, the upper portion (46, 46') has a first doping concentration, the multiple spaced-apart finger regions (36, 36') have a second doping concentration, and wherein the second doping concentration is comparable with or exceeds the first doping concentration. According to a still further embodiment, the buried further region (44, 44') has a third doping concentration less than the second doping concentration. According to a yet further embodiment, the first parts (461, 461') of the upper portion (46, 46') and the further buried region (44, 44') are formed using ion implantation through a common mask. According to a still yet further embodiment, the upper portion (46, 46') and the further buried region (44, 44') have doping concentrations that differ by less than an order of magnitude.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A Schottky diode having first and second terminals, comprising:
   a semiconductor (SC) substrate having a first region of a first conductivity type and first doping concentration proximate a first surface of the substrate;
   a Schottky electrode contact on the first surface of the first region forming a Schottky junction therebetween, wherein the Schottky electrode contact is ohmically coupled to the first terminal;
   a second region of the first conductivity type and second doping, contacting the first region, laterally separated from the Schottky electrode contact and ohmically coupled to the second terminal;
   multiple finger regions of a second, opposite, conductivity type and third doping ohmically coupled to the first terminal and extending from the first region into the second region, wherein first portions of the second region lies between the multiple finger regions; and
   a further region of the second conductivity type and fourth doping, located in the second region spaced apart from the first surface by the first portions of the second region and ohmically coupled to the first terminal,
   wherein the further region, the multiple finger regions and the second region form a junction field effect transistor (JFET), with the further region and the multiple substantially parallel finger regions adapted to act as gates of the JFET and the second region adapted to contain a channel of the JFET.

2. The diode of claim 1, where the multiple finger regions are substantially parallel.

3. The diode of claim 1, where the multiple finger regions are divided substantially into two groups, a first group of multiple substantially parallel finger regions extending away from the Schottky electrode contact in a first direction and a second group of multiple substantially parallel finger regions extending away from the Schottky electrode contact in a second direction.

4. The diode of claim 3, wherein the first and second directions are substantially anti-parallel.

5. The diode of claim 1, wherein the multiple finger regions are more heavily doped than portions of the second region lying between the multiple finger regions, and wherein the multiple finger regions are comparably or more heavily doped than the first region.

6. The diode of claim 1, wherein first region is comparably or more heavily doped than the first portions of the second region.

7. The diode of claim 1, therein the further region underlies at least part of the first portion of the second region.

8. The diode of claim 7, wherein the further region also underlies at least part of the second portion of the second region or the first region.

9. The diode of claim 1, wherein when the diode is reverse biased, the channel of the JFET is substantially depleted of free carriers for voltages above a predetermined magnitude.

10. A Schottky device, comprising:
    first and second terminals, wherein the first terminal comprises a Schottky contact;
    a JFET within the Schottky device having a current path of a first conductivity type serially coupled between the first terminal and the second terminal;
    multiple finger regions laterally outboard of the Schottky contact and of a second, opposite, conductivity type and substantially enclosing a portion of the current path between the first terminal and the second terminal; and
    a buried region of the second conductivity type at least partly underlying the current path and ohmically coupled to the multiple finger regions,
    wherein the multiple finger regions and the buried region are electrically coupled to the first terminal and adapted to at least partially pinch off the current path in response to a reverse bias applied between the first terminal and the second terminal.

11. The device of claim 10, wherein the buried region intersects a portion of the multiple finger regions.

12. The device of claim 10, wherein the multiple finger regions are substantially parallel or anti-parallel.

13. The device of claim 12, wherein about half of the multiple finger regions are located on a first side of the Schottky contact and about half are located on a second side of the Schottky contact.

14. The device of claim 10, wherein the current path is N type.

15. The device of claim 14, wherein the multiple finger regions are more heavily doped than at least part of the current path.

16. A Schottky diode comprising:
    a semiconductor containing substrate having an upper surface;
    an upper portion of the substrate doped to have a first conductivity type extending substantially to the upper surface;

multiple spaced-apart finger regions of a second, opposite conductivity type, wherein first parts of the upper portion of the substrate lie between some of the spaced-apart finger regions;

a buried further region of the second, opposite, conductivity type underlying at least part of the first parts of the upper portion;

a Schottky contact on a part of the upper surface lying laterally beyond the spaced-apart finger regions;

a first terminal of the device coupled to the spaced-apart finger regions, the further buried region, and the Schottky contact; and a second terminal of the device coupled to a second part of the upper portion.

17. The diode of claim 16, wherein:
the upper portion has a first doping concentration; and
the multiple spaced-apart finger regions have a second doping concentration that is comparable with or exceeds the first doping concentration.

18. The diode of claim 17, wherein the buried further region has a third doping concentration less than the second doping concentration.

19. The diode of claim 16, wherein the upper portion and the further buried region have doping concentrations that differ by less than an order of magnitude.

* * * * *